United States Patent
Shimizu et al.

(10) Patent No.: US 6,377,292 B1
(45) Date of Patent: Apr. 23, 2002

(54) LED PRINT HEAD WITH REDUCED REFLECTION OF LIGHT LEAKING FROM EDGES OF LED ARRAY CHIPS

(75) Inventors: Takatoku Shimizu; Norio Nakajima, both of Tokyo (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 09/546,871

(22) Filed: Apr. 10, 2000

(30) Foreign Application Priority Data

Apr. 23, 1999 (JP) .......................................... 11-116468

(51) Int. Cl.[7] .................................................. B41J 2/45
(52) U.S. Cl. ........................................ 347/238; 347/130
(58) Field of Search ................................. 347/171, 238, 347/244, 130; 205/118, 125; 361/761, 762; 156/278, 274.8, 280

(56) References Cited

U.S. PATENT DOCUMENTS

| | | | |
|---|---|---|---|
| 5,317,344 A | * | 5/1994 | Beaman et al. .............. 347/244 |
| 5,601,684 A | * | 2/1997 | Shiga .......................... 156/278 |
| 5,986,682 A | * | 11/1999 | Itou ............................ 347/171 |

FOREIGN PATENT DOCUMENTS

| | | | | |
|---|---|---|---|---|
| JP | 58-101474 | * | 6/1983 | ........... H01L/31/12 |
| JP | WO-97/03460 | * | 1/1997 | ........... H01L/21/60 |

* cited by examiner

*Primary Examiner*—Hai C. Pham
(74) *Attorney, Agent, or Firm*—Akin, Gump, Strauss, Hauer & Feld, L.L.P.

(57) ABSTRACT

A print head has an array of surface-emitting light-emitting diodes formed in a chip, near one edge of the chip. The chip is mounted on a conductive pattern on the component surface of a printed circuit board. The printed circuit board includes a material, exposed on the component surface throughout a region adjacent to the above-mentioned edge of the chip, that is less optically reflective than the conductive pattern. Emitted light that leaks through the chip edge is partly or completely absorbed by the exposed material, instead of being reflected by the conductive pattern. The exposed material may be a dielectric coating, a dielectric substrate, or a conductive paste that also bonds the chip to the conductive pattern.

11 Claims, 10 Drawing Sheets

LED PRINT HEAD WITH REDUCED REFLECTION OF LIGHT LEAKING FROM EDGES OF LED ARRAY CHIPS

BACKGROUND OF THE INVENTION

The present invention relates to the print head of an electrophotographic printer, more particularly to a print head employing light-emitting diodes as light sources.

In the electrophotographic printing process, the surface of a uniformly charged photosensitive drum is illuminated to form a latent electrostatic image. This image is developed to create a toner image, which is then transferred to a sheet of paper. A light-emitting-diode (LED) print head uses a linear array of LEDs to provide the necessary illumination of the photosensitive drum.

An LED print head comprises an LED unit including the linear array of LEDs, a lens array that focuses the light emitted by the LEDs onto the photosensitive drum, and a lens holder that holds the lens array and the LED unit. The LED unit comprises a printed circuit board, a plurality of LED array chips, and a plurality of integrated-circuit chips that drive the LED array chips. The LED array chips are mounted on the surface of the printed circuit board, the undersides of the LED array chips being bonded directly to a conductive ground pattern exposed on the surface of the printed circuit board.

For reasons of economy, the LED array chips are conventionally made as narrow as possible. The LEDs are therefore located near one edge of each chip. Furthermore, since the ground pattern must conduct return current from all the LED array chips with negligible voltage drop, the ground pattern must be comparatively wide. The ground pattern is conventionally wider than the LED array chips, and the highly reflective surface of the ground pattern is partly exposed around the edges of the LED array chips.

This creates a problem. Although the LEDs are basically surface-emitting devices, since they are disposed near the edges of the LED array chips, some of the emitted light leaks through the edges of the chips, and enters the lens array after being reflected from the exposed surface of the ground pattern. If the reflected light is sufficiently strong, it can create printing blemishes and reduce the resolution of the print head. A more detailed description of this problem will be given below.

SUMMARY OF THE INVENTION

An object of the present invention is to improve printing quality by reducing unwanted reflection of light in an LED print head.

Another object of the invention is to improve printing quality by assuring level mounting of the LED array chips in an LED print head.

The invented LED print head has at least one LED array chip with an array of light-emitting diodes formed near one edge. The diodes emit light through the surface of the LED array chip, but some of the light also leaks through this edge of the LED array chip.

The LED array chip is mounted on the component surface of a printed circuit board. The component surface has a first region, in which the LED array chip is mounted, and a second region adjacent to the first region. The second region extends up to the above-mentioned edge of the LED array chip, and is adjacent to all parts of this edge.

The printed circuit board has a conductive pattern to which the LED array chip is electrically coupled and mechanically bonded in the first region of the component surface.

The printed circuit board also has a material exposed on the component surface in all parts of the second region. This material is less optically reflective than the conductive pattern, and absorbs at least some of the light that leaks through the edge of the LED array chip.

The exposed material is, for example, a dielectric coating that protects the component surface of the printed circuit board. This coating covers all of the second region, covers part of the first region, supports the above-mentioned edge of the LED array chip, and at least partly supports the opposite edge of the LED array chip.

Alternatively, the material exposed in the second region is a conductive paste that covers both the first and second regions, mechanically and electrically coupling the LED array chip to the conductive pattern.

As another alternative, the material exposed in the second region may be the dielectric substrate of the printed circuit board.

In all three of these cases, the comparatively low optical reflectivity of the exposed material reduces reflection of light from the second region.

Level mounting is maintained because the LED array chip is supported either on the level surface of the conductive pattern, or on the level surface of the dielectric coating.

DETAILED DESCRIPTION OF THE INVENTION

An example of the conventional art and several embodiments of the invention will now be described with reference to the attached drawings, in which like parts are indicated by like reference characters.

Figure 1:
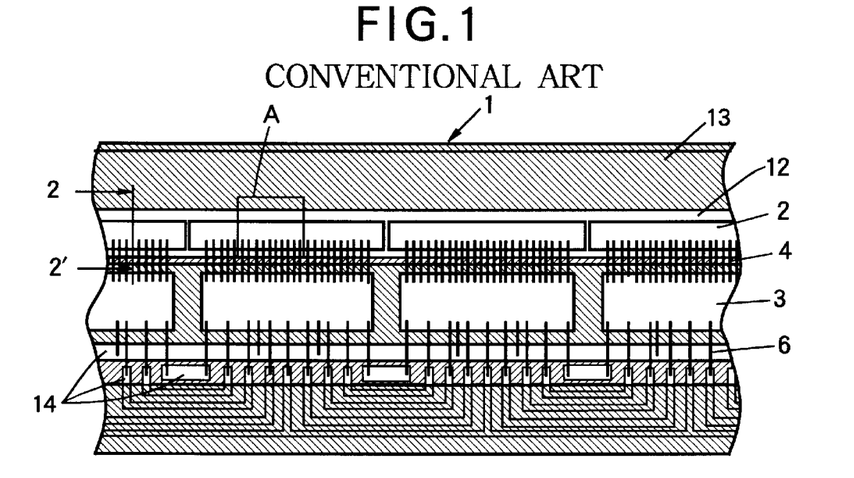
FIG. 1 is a plan view of part of the LED unit in a conventional LED print head.

Referring to FIG. 1, the LED unit in the conventional art comprises a printed circuit board 1 with a row of LED array chips 2 mounted on its component surface, and a row of driver integrated circuits (ICs) 3 mounted in another row on the component surface, parallel to the row of LED array chips. The driver ICs 3 are electrically coupled to the LED array chips 2 by bonding wires 4, and to conductive patterns on the surface of the printed circuit board 1 by further bonding wires 6.

Figure 2:
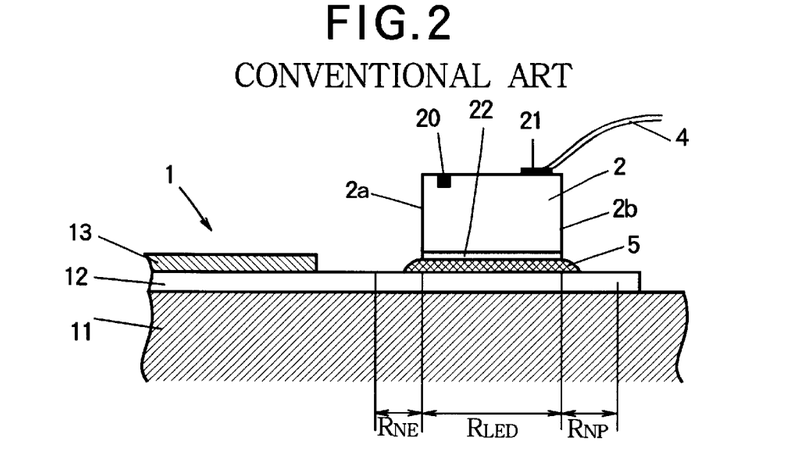
FIG. 2 is a sectional view through line 2–2' in FIG. 1.

Referring to FIG. 2, the LED array chips 2 are mechanically bonded and electrically coupled to the component surface of the printed circuit board 1 by a conductive paste 5 such as a silver paste. The printed circuit board 1 includes a dielectric substrate 11, a conductive ground pattern 12 formed on the surface of the substrate 11, and a dielectric coating 13 partly covering the conductive ground pattern 12. The conductive paste 5 bonds the undersides of the LED array chips 2 to the exposed surface of the ground pattern 12. The conductive paste 5 may be considered to be part of the printed circuit board 1.

The driver ICs 3 are bonded to the printed circuit board 1 by a non-conductive adhesive.

Referring again to FIG. 1, conductive wiring patterns 14 for the driver ICs 3 are also formed on the surface of the printed circuit board 1, and these patterns 14 are also partly covered by the dielectric coating 13. The bonding wires 6 are attached to the exposed parts of these driver wiring patterns 14. The driver wiring patterns 14 include power-supply and ground patterns for the driver ICs 3, and signal lines for supplying print data and control signals to the driver ICs 3.

The conductive patterns 12 and 14 are, for example, copper foil patterns. The exposed parts of the conductive patterns 12, 14 are plated with gold, to prevent corrosion and facilitate wire bonding.

Figure 3:
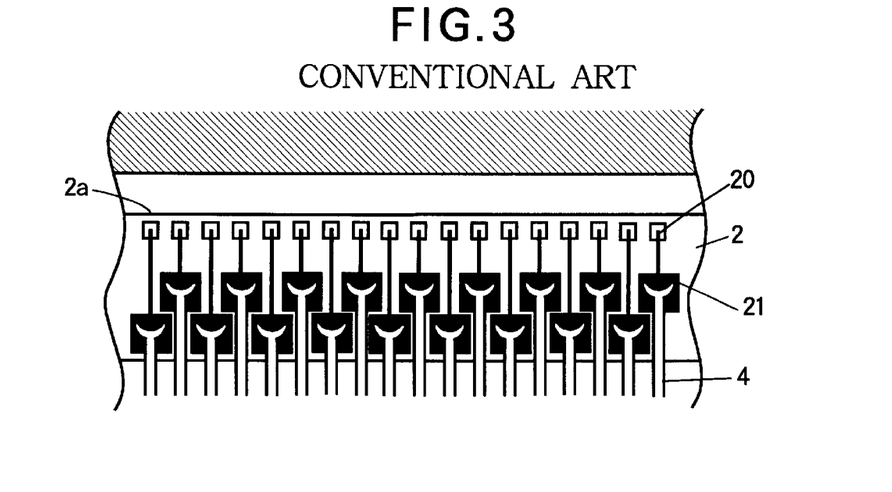
FIG. 3 is an enlarged plan view of part A in FIG. 1.

Referring to FIG. 3, the LEDs 20 in each LED array chip 2 are disposed in a row near one edge 2a of the chip. The LEDs 20 are separated from this edge 2a by, for example, a distance of forty micrometers (40 µm). Each LED 20 comprises a pn junction, the anode of which is coupled by an electrode line to a bonding pad 21. The bonding wires 4 are attached to the bonding pads 21.

Referring again to FIG. 2, each LED array chip 2 also has a return electrode 22 formed on its lower surface as a common cathode electrode for the LEDs 20. The LEDs 20 are driven individually by current supplied from the driver ICs 3 through the bonding wires 4, according to print data loaded into the driver ICs 3. The current returns through the body of the LED array chip 2, the return electrode 22, and the conductive paste 5 to the conductive ground pattern 12.

The component surface of the printed circuit board 1 includes a region disposed directly beneath the LED array chips 2, denoted $R_{LED}$; an adjacent region $R_{NE}$ disposed just in front of the edges 2a of the LED array chips 2 near which the LEDs 20 are formed; and another adjacent region $R_{NP}$ disposed just in front of the edges 2b of the LED array chips 2 near which the bonding pads 21 are formed.

The exposed parts of the ground pattern 12 include the parts disposed in the regions $R_{NE}$, $R_{NP}$ adjacent to the edges 2a, 2b of the LED array chips 2. The dielectric coating 13 comprises, for example, a layer of a solder resist material that protects the surface of the printed circuit board 1, and especially the surfaces of the conductive patterns 12, 14.

Figure 4:
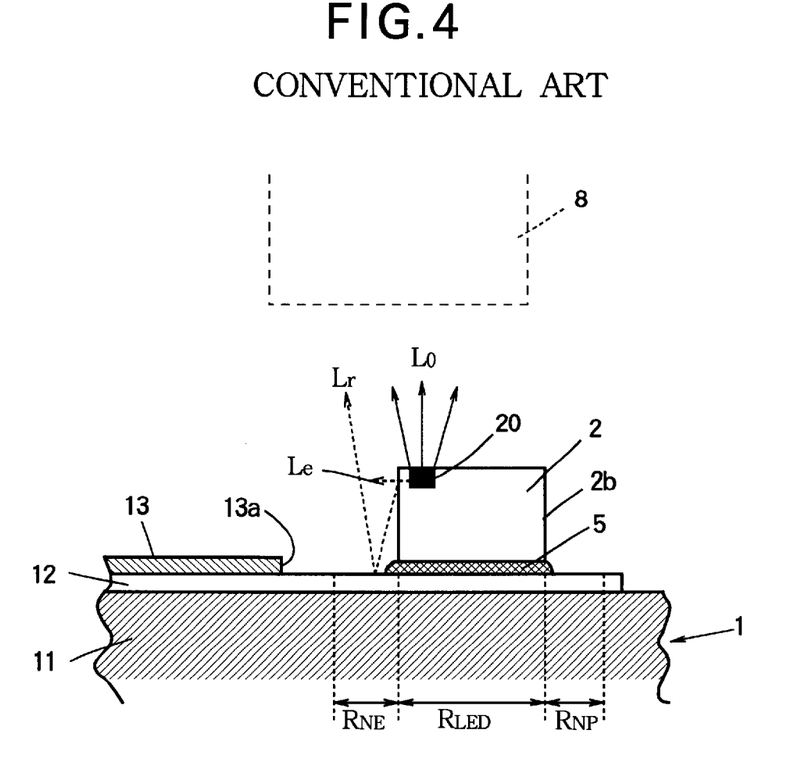
FIG. 4 is another sectional view through line 2–2' in FIG. 1, illustrating paths taken by emitted light.

FIG. 4 illustrates the operation of the conventional art, and the problem mentioned above. When an LED 20 is driven, light Lo is emitted from the surface of the LED and focused by the lens array 8 onto the photosensitive drum (not visible). As the LED 20 is very close to one edge 2a of the LED array chip 2, some light Le is also emitted through this edge 2a of the chip. Some of the light emitted through the edge 2a is reflected by the surface of the conductive ground pattern 12 exposed in the adjacent region $R_{NE}$. The gold plating makes this surface highly reflective. Some of the reflected light Lr enters the lens array 8, and is focused to an unintended location on the photosensitive drum. If the reflected light Lr exceeds the sensitivity threshold of the photosensitive drum, the printed image will be blemished. Specific printing problems include incorrect printing density, poor resolution, and so-called 'ghosts.'

Figure 5:
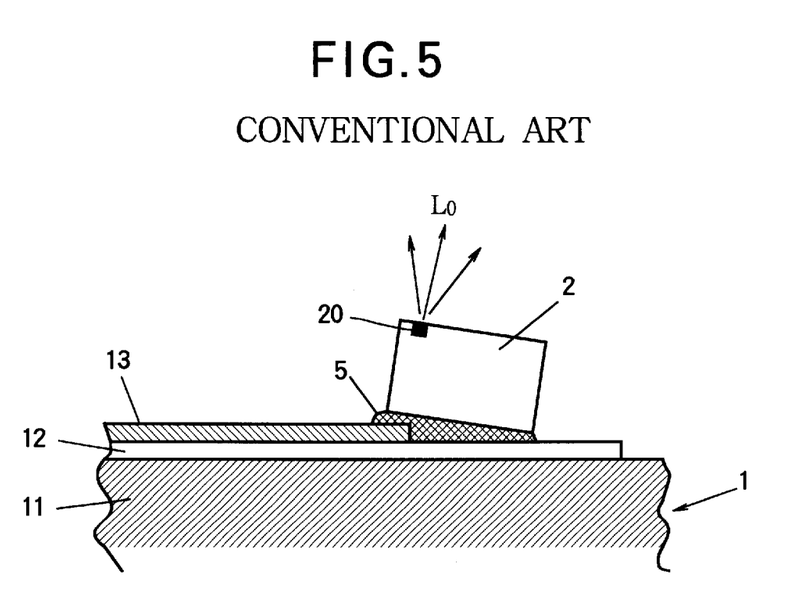
FIG. 5 is a similar sectional view illustrating a result of mounting alignment error.

A simple solution to this problem would be to eliminate exposure of the ground pattern 12 in the adjacent region $R_{NE}$, by mounting the LED array chips 2 flush with the edge 13a of the dielectric coating 13, which has a comparatively non-reflective surface. This turns out to be impractical, however, because it is not possible to pattern the dielectric coating 13 and position the LED array chips 2 with the necessary accuracy. Inaccurate patterning and positioning may lead to a gap in the region $R_{NE}$, allowing unwanted reflection to occur, or may cause the edge of an LED array chip 2 to overlap the edge of the dielectric coating 13, so that the LED array chip 2 is tilted at an angle, as illustrated in FIG. 5. This tilt affects printing quality adversely by causing the light Lo emitted from the surface of the LED array chip 2 to enter the lens array at the wrong angle.

Figure 6:
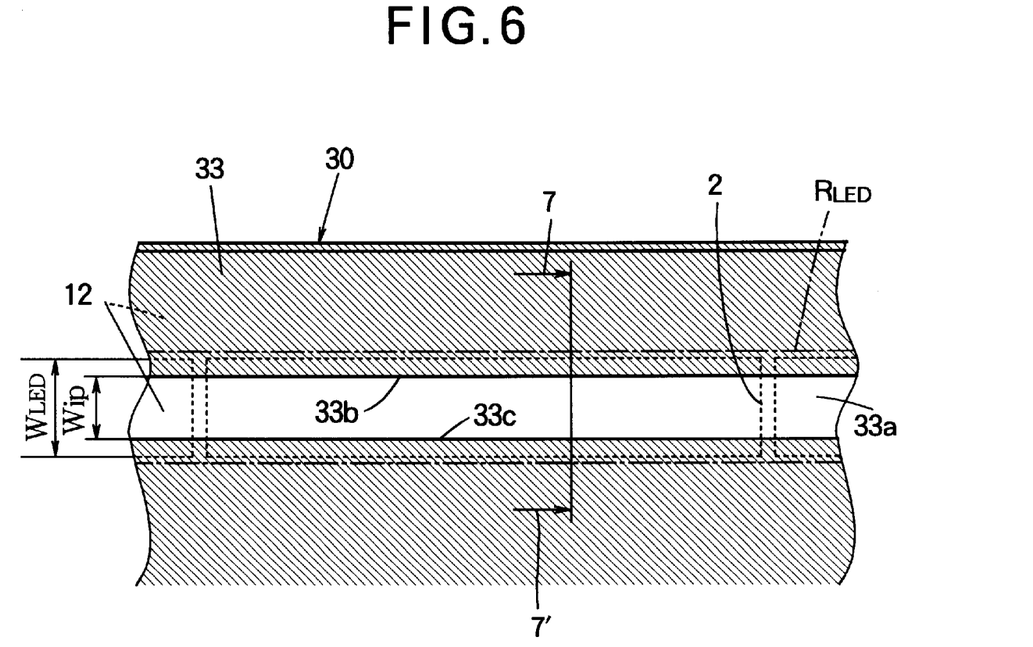
FIG. 6 is a plan view of part of the LED unit in a first embodiment of the invention.

A first embodiment of the invention is an LED print head with an LED unit combining the LED array chips 2, driver ICs 3, and bonding wires 4, 6 of the conventional art with the printed circuit board 30 shown in FIG. 6. This printed circuit board 30 differs from the conventional art in that the conductive ground pattern 12 is exposed on the component surface only inside the region $R_{LED}$ below the LED array chips 2. The rest of the conductive ground pattern 12 is covered by a dielectric coating 33.

Figure 7:
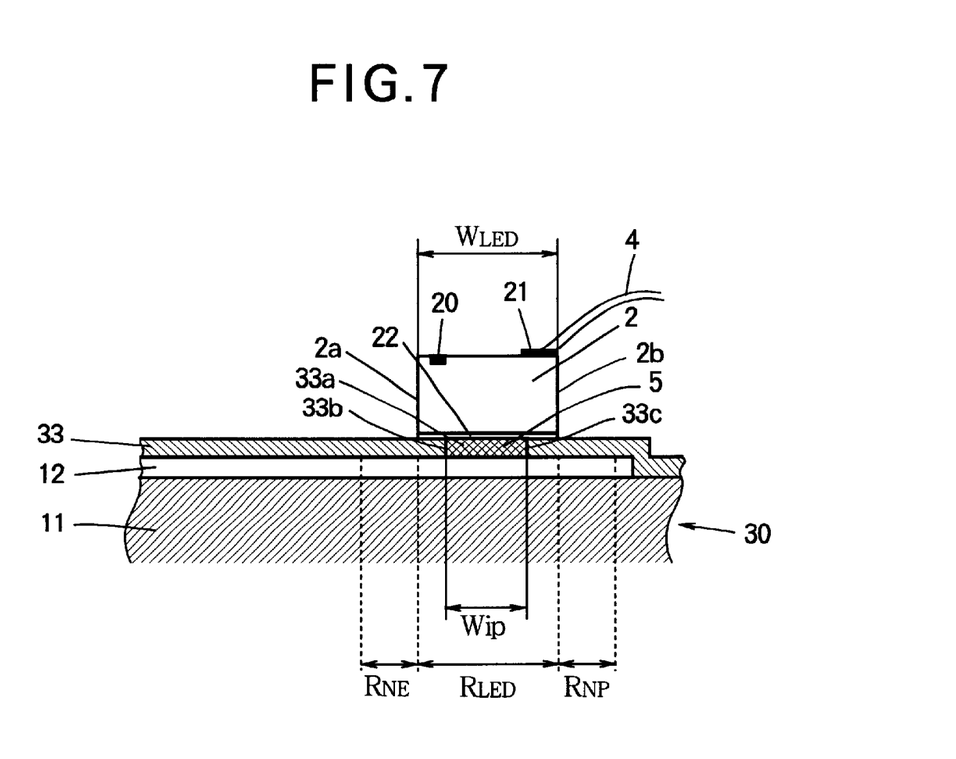
FIG. 7 is a sectional view through line 7–7' in FIG. 6.

Referring to FIG. 7, the printed circuit board 30 comprises a dielectric substrate 11, the conductive ground pattern 12, the dielectric coating 33, a driver wiring pattern (not visible), and the conductive paste 5. The driver wiring pattern is identical to the driver wiring pattern 14 in the conventional art. The dielectric substrate 11 is, for example, a glass-epoxy substrate. The conductive ground pattern 12 comprises gold-plated copper foil. The dielectric coating 33 comprises, for example, an epoxy-based solder resist of a green color. The LEDs 20 emit, for example, red light with a wavelength of seven hundred forty nanometers (740 nm). Red and green being complementary colors, this combination of colors causes light emitted by the LEDs 20 to be strongly absorbed by the dielectric coating 33.

The dielectric coating 33 is formed by screen printing on the component surface of the printed circuit board 30. The thickness of the dielectric coating 33 is, for example, in the range from ten to thirty-five micrometers (10 µm to 35 µm). Alternatively, the dielectric coating 33 comprises a photosensitive solder resist, which is applied to the entire component surface of the printed circuit board 30, then patterned to form a slit 33a that exposes the conductive ground pattern 12. In either case, the conductive paste 5 fills the slit 33a, electrically coupling the return electrodes 22 of the LED array chips 2 to the conductive ground pattern 12.

To carry return current from all of the LED array chips 2 without appreciable voltage drop, the conductive ground pattern 12 is wider than the region $R_{LED}$ beneath the LED array chips 2, but the surface of the conductive ground pattern 12 is not exposed in the adjacent regions $R_{NE}$, $R_{NP}$, these regions both being covered by the dielectric coating 33. The dielectric coating 33 also covers part of the region $R_{LED}$ beneath the LED array chips 2. The two mutually opposite edges 2a, 2b of each LED array chip 2 are supported on the dielectric coating 33.

The width $W_{ip}$ of the slit 33a is thus less than the width $W_{LED}$ of the LED array chips 2. The difference between these widths $W_{ip}$ and $W_{LED}$ should be sufficient to assure that the edges 33b, 33c of the slit 33a are disposed inward of the edges 2a, 2b of the LED array chips 2, despite any alignment errors that may occur when the LED array chips 2 are mounted. For example, if the width of the LED array chips 2 is five hundred micrometers ($W_{LED}$=500 $\mu$m), the patterning accuracy of the edges 33b, 33c of the dielectric coating 33 is ±100 $\mu$m, and the mounting alignment accuracy of the LED array chips 2 is ±10 $\mu$m, then the width of the slit 33a should be less than two hundred eighty micrometers ($W_{ip}$<280 $\mu$m)

The conductive paste 5 is, for example, a heat-curable epoxy resin mixed with silver particles. The LED array chips 2 are mounted on the printed circuit board 30 by the following process. An amount of conductive paste 5 sufficient to fill the slit 33a, or slightly more, is applied by stamp transfer or screen printing, covering the exposed surface of the conductive ground pattern 12. The LED array chips 2 are then positioned over the $R_{LED}$ region, pressed down onto the conductive paste 5, and aligned by well-known methods. When the alignment is completed, the conductive paste 5 is cured by heating.

When the LED array chips 2 are pressed down onto the conductive paste 5, their edges 2a, 2b come to rest on the dielectric coating 33. Since two opposite edges of each LED array chip 2 are supported firmly by the dielectric coating 33, the LED array chips 2 are always mounted level; the problem of tilting does not occur. The light emitted upward from the surfaces of the LEDs 20 always enters the lens array at the correct angle.

Light leaking through the edge 2a of the LED array chips 2 is not reflected by the conductive ground pattern 12, being absorbed instead by the dielectric coating 33. Therefore, the problem of reflected light entering the lens array does not occur. Reflection is suppressed particularly effectively if the light is red and the dielectric coating 33 is green, as mentioned above.

Figure 8:
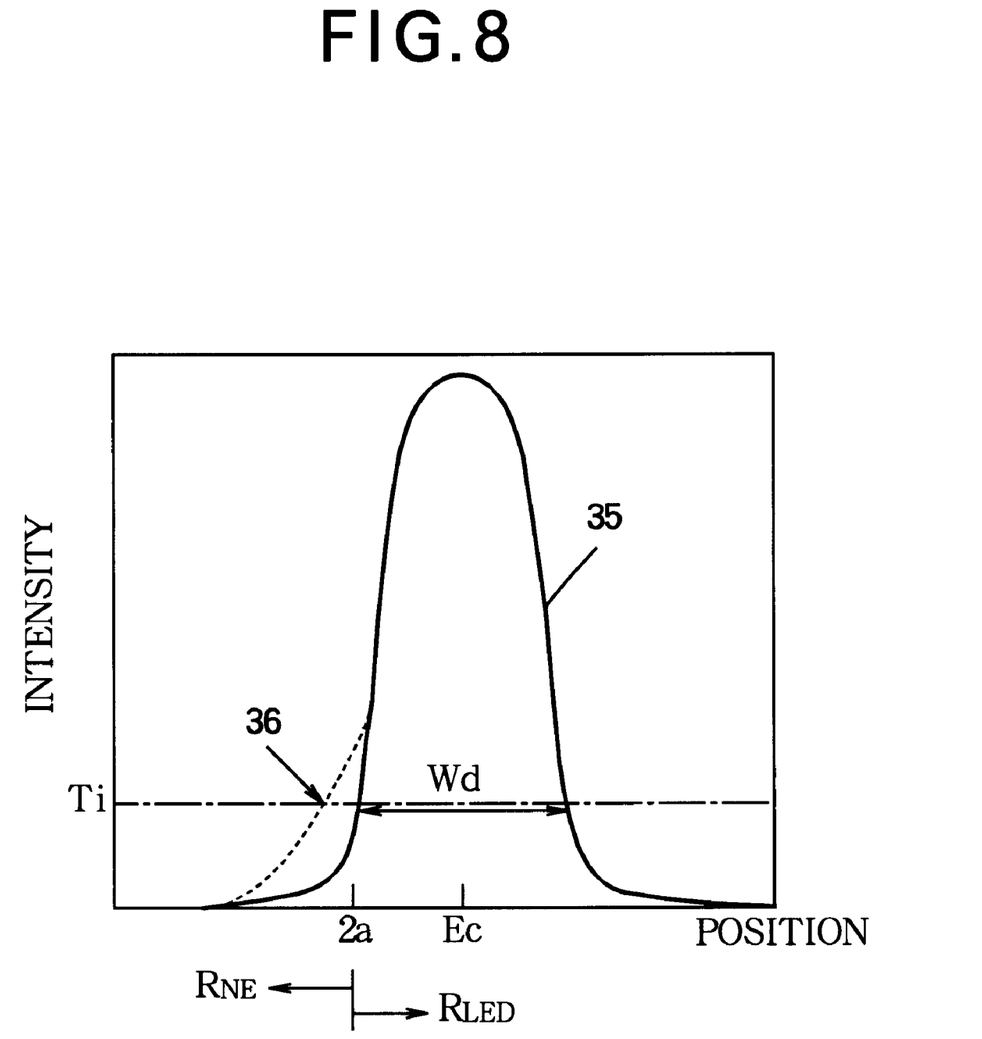
FIG. 8 is a graph comparing light intensity distributions in the first embodiment and the conventional LED print head.

FIG. 8 compares the light intensity distribution of the first embodiment with that of the conventional art. The horizontal axis represents position in the direction parallel to line 7–7' in FIG. 6. Ec indicates the center line of the LEDs 20. The edge 2a of the LED array chip 2 is also indicated. The vertical axis represents light intensity. Ti is the threshold intensity of the photosensitive drum. The solid curve 35 represents the intensity distribution of the first embodiment. The dotted curve 36 represents the intensity distribution in the conventional art. The two distributions differ in their width at the threshold intensity level Ti, because reflection from the conductive ground pattern 12 increases the width of the conventional distribution 36 beyond the width Wd in the first embodiment. In other words, the first embodiment prints smaller dots, thereby increasing the printing resolution and improving the printing quality.

By assuring that the light emitted from the surfaces of the LEDs 20 enters the lens array at the correct angle, and that light leaking through the edges 2a of the LED array chips is not reflected into the lens array, the first embodiment provides an LED print head with a consistently high level of printing quality.

Figure 9:
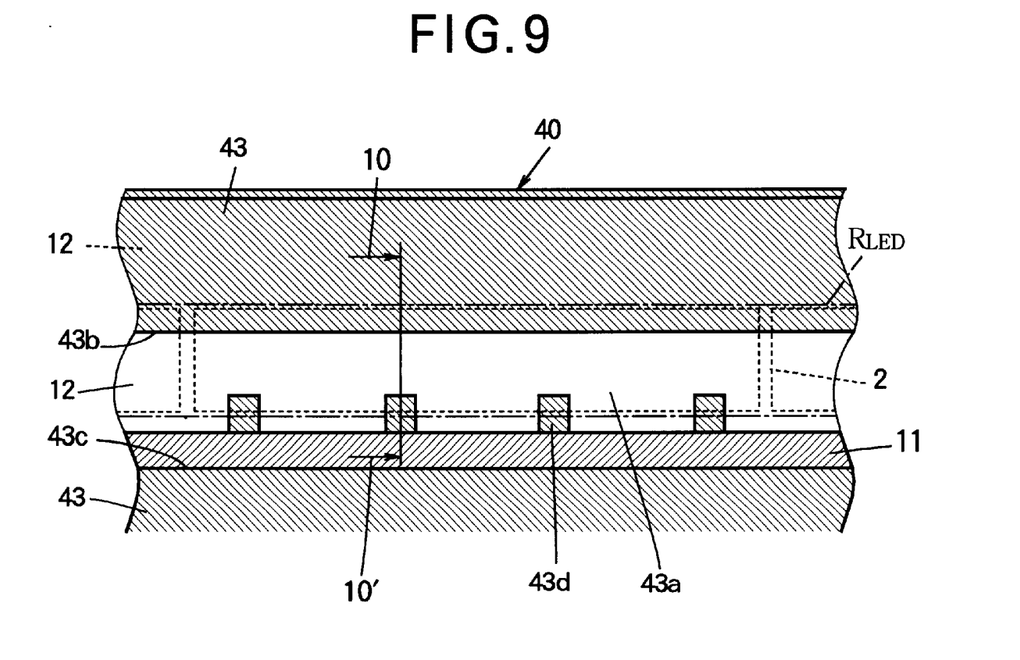
FIG. 9 is a plan view of part of the LED unit in a second embodiment of the invention.

A second embodiment of the invention is an LED print head with an LED unit combining the LED array chips 2, driver ICs 3, and bonding wires 4, 6 of the conventional art with the printed circuit board 40 shown in FIG. 9. This printed circuit board 40 differs from the printed circuit board of the first embodiment in that the dielectric coating 43 covers less of the conductive ground pattern 12, and includes a series of islands 43d supporting one edge of the LED array chips 2.

Figure 10:
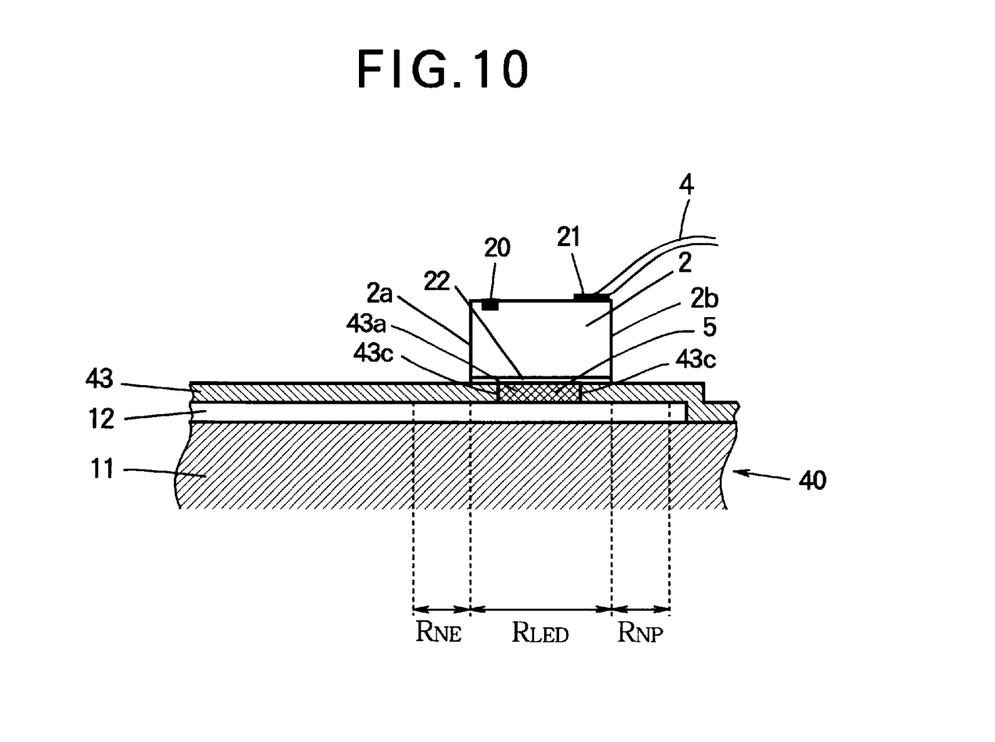
FIG. 10 is a sectional view through line 10—10' in FIG. 9.

The printed circuit board 40 comprises the dielectric substrate 11, the conductive ground pattern 12, the dielectric coating 43, a driver wiring pattern (not visible), and the conductive paste 5, shown in FIG. 10. The dielectric substrate 11, conductive ground pattern 12, driver wiring pattern, and conductive paste 5 are identical to the corresponding elements in the first embodiment. The dielectric coating 43 comprises, for example, an epoxy-based green solder resist. The dielectric coating 43 completely covers the region $R_{NE}$ adjacent to the edge 2a of the LED array chips 2 near the LEDs 20, and extends partly into the region $R_{LED}$ below the LED array chips 2, as in the first embodiment, but the slit 43a in the dielectric coating 43 is not confined to this region $R_{LED}$. Although one edge 43b of the slit 43a is disposed below the LED array chips 2, the other edge 43c is removed a certain distance from the LED array chips 2, as shown in FIG. 9. Part of the dielectric substrate 11 is exposed between the edge of the conductive ground pattern 12 and this edge 43c of the dielectric coating 43. The islands 43d are disposed within the slit 43a, below the edges 2b of the LED array chips 2 near the bonding pads 21. The islands 43d cover part of the region $R_{NP}$ adjacent to this edge 2b.

When the LED array chips 2 are mounted on the printed circuit board 40, first the conductive paste 5 is applied to the part of the region $R_{LED}$ that is disposed within the slit 43a, avoiding the islands 43d. When the LED array chips 2 are pressed down onto the conductive paste 5, one edge 2b of each LED array chip 2 comes to rest at several points on the islands 43d of the dielectric coating 43. The other edge 2a of the LED array chip 2 is entirely supported by the dielectric coating 43, as in the first embodiment. Since both edges 2a, 2b are supported by the dielectric coating 43, the LED array chip 2 is mounted in a level posture. The LED array chips 2 are aligned, then the conductive paste 5 is cured, by heating for example.

The second embodiment provides the same effects as the first embodiment in that level mounting of the LED array chips 2 is assured, and light leaking through edges 2a of the LED array chips 2 is absorbed by the dielectric coating 43 instead of being reflected from the conductive ground pattern 12. In addition, the second embodiment provides a greater area of electrical contact between the LED array chips 2 and the conductive ground pattern 12, because the LED array chips 2 make electrical contact with the ground pattern 12 between the islands 43d. The electrical resistance of the common return path of the current that drives the LEDs 20 is thereby reduced, lessening the power needed to drive the LEDs 20.

Figure 11:
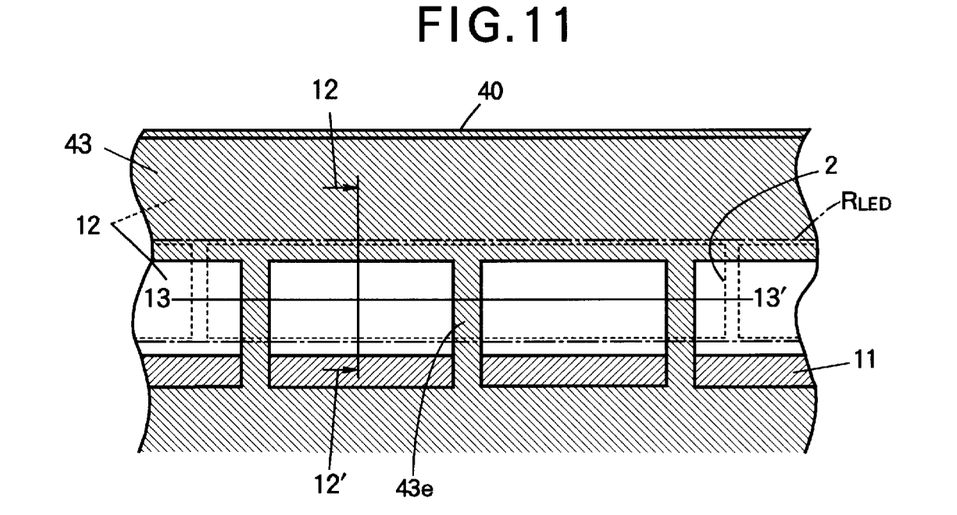
FIG. 11 is a plan view of part of the LED unit in a variation of the second embodiment.
Figure 12:
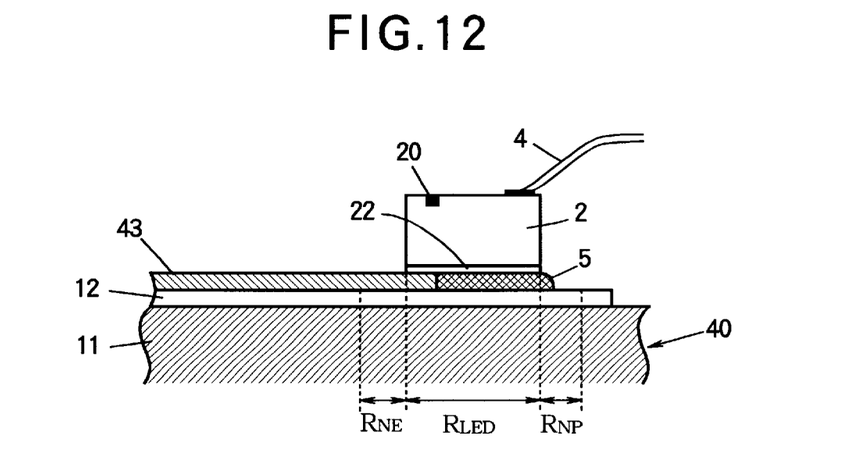
FIG. 12 is a sectional view through line 12—12' in FIG. 11.
Figure 13:
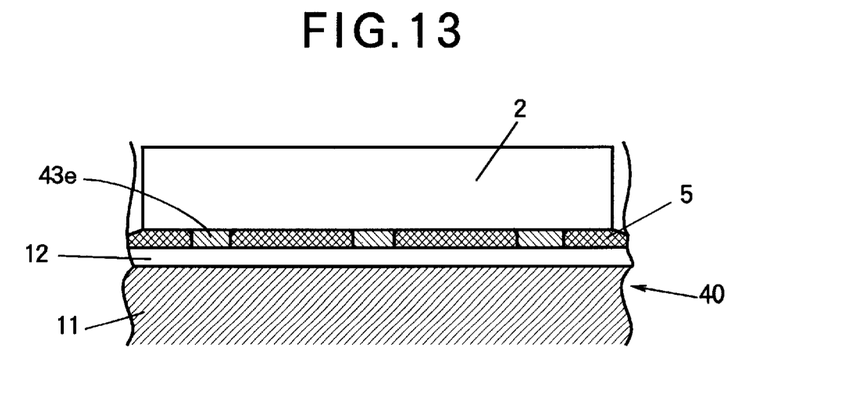
FIG. 13 is a sectional view through line 13—13' in FIG. 11.

In a variation of the second embodiment, the islands 43d are elongated into bridges 43e connecting the two edges of the dielectric coating 43, as shown in FIG. 11. This arrangement provides more support for the LED array chips 2 than in FIG. 9, while still allowing a greater area of electrical contact between the LED array chips 2 and conductive ground pattern 12 than in the first embodiment. FIG. 12 shows a sectional view through an area avoiding the bridges of the dielectric coating 43. FIG. 13 shows a sectional view in the longitudinal direction of the array, showing how an LED array chip 2 is supported by three bridges 43e of the dielectric coating.

A third embodiment of the invention is an LED print head with an LED unit combining the printed circuit board 1, LED array chips 2, driver ICs 3, and bonding wires 4, 6 of the conventional art with an enlarged layer of conductive paste.

Figure 14:
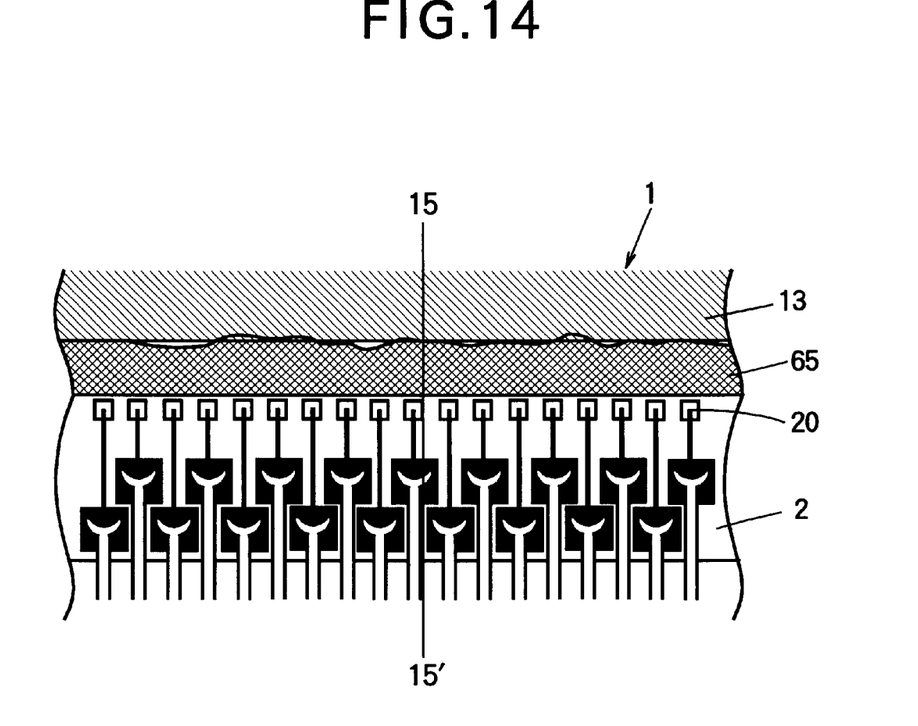
FIG. 14 is a plan view of part of the LED unit in a third embodiment of the invention.

Referring to FIG. 14, the conductive paste 65 covers substantially all of the conductive ground pattern 12 from the edge of the LED array chips 2 near the LEDs 20 to the edge of the dielectric coating 13. The conductive paste 65 is, for example, a heat-curable silver paste comprising silver particles embedded in an epoxy resin, the silver particles constituting seventy percent (70%) of the weight of the paste. Although silver is reflective, the layer of conductive paste 65 does not have a mirror-like surface; the silver particles scatter incident light in all directions. The surface reflectivity of a seventy-percent silver conductive paste 65 is only half (50%) the reflectivity of the gold-plated surface of the conductive ground pattern 12. If necessary, the reflectivity can be further reduced by mixing a small amount of carbon black into the conductive paste 65.

Figure 15:
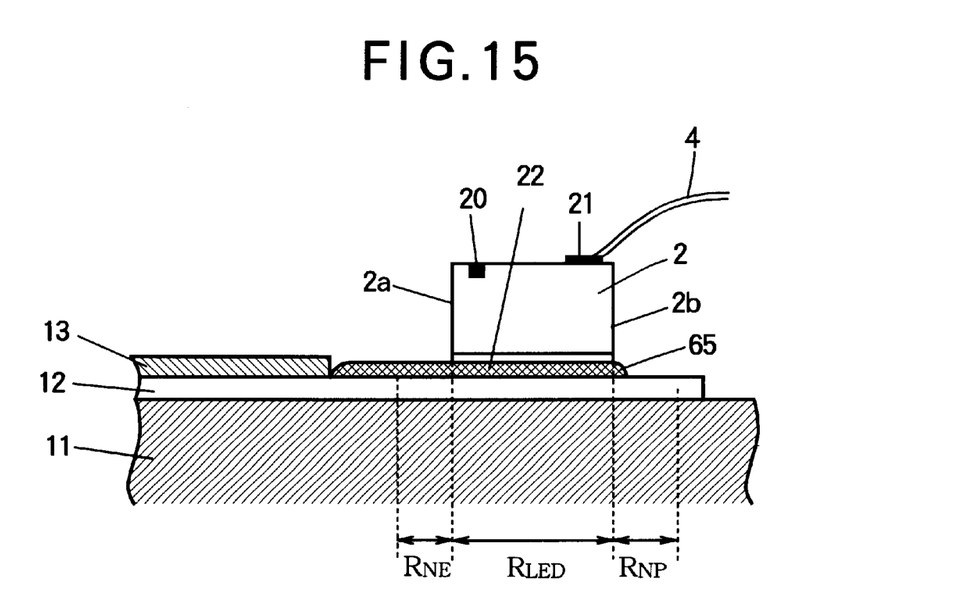
FIG. 15 is a sectional view through line 15—15' in FIG. 14.

Referring to FIG. 15, the conductive paste 65 covers all of the region $R_{LED}$ below the LED array chips 2, and all of the adjacent region $R_{NE}$ near the LEDs 20. The area of electrical contact with the conductive ground pattern 12 is thereby increased. The LED array chips 2 are mounted level because the conductive paste 65 is applied as a thin layer to the level surface of the conductive ground pattern 12.

When the LED array chips 2 are mounted, first the conductive paste 65 is applied by stamp transfer or screen printing, entirely covering the region $R_{LED}$ in which the LED array chips 2 will be mounted and the adjacent region $R_{NE}$ on the LED side of the chips 2. Then the LED array chips 2 are lowered onto the conductive paste 65, pressed down, and aligned. A safe distance is left between the edge of the dielectric coating 13 and the edges 2a of the LED array chips 2, so there is no risk of tilted mounting. When the LED array chips 2 have been aligned, the conductive paste 65 is cured by heating.

Figure 16:
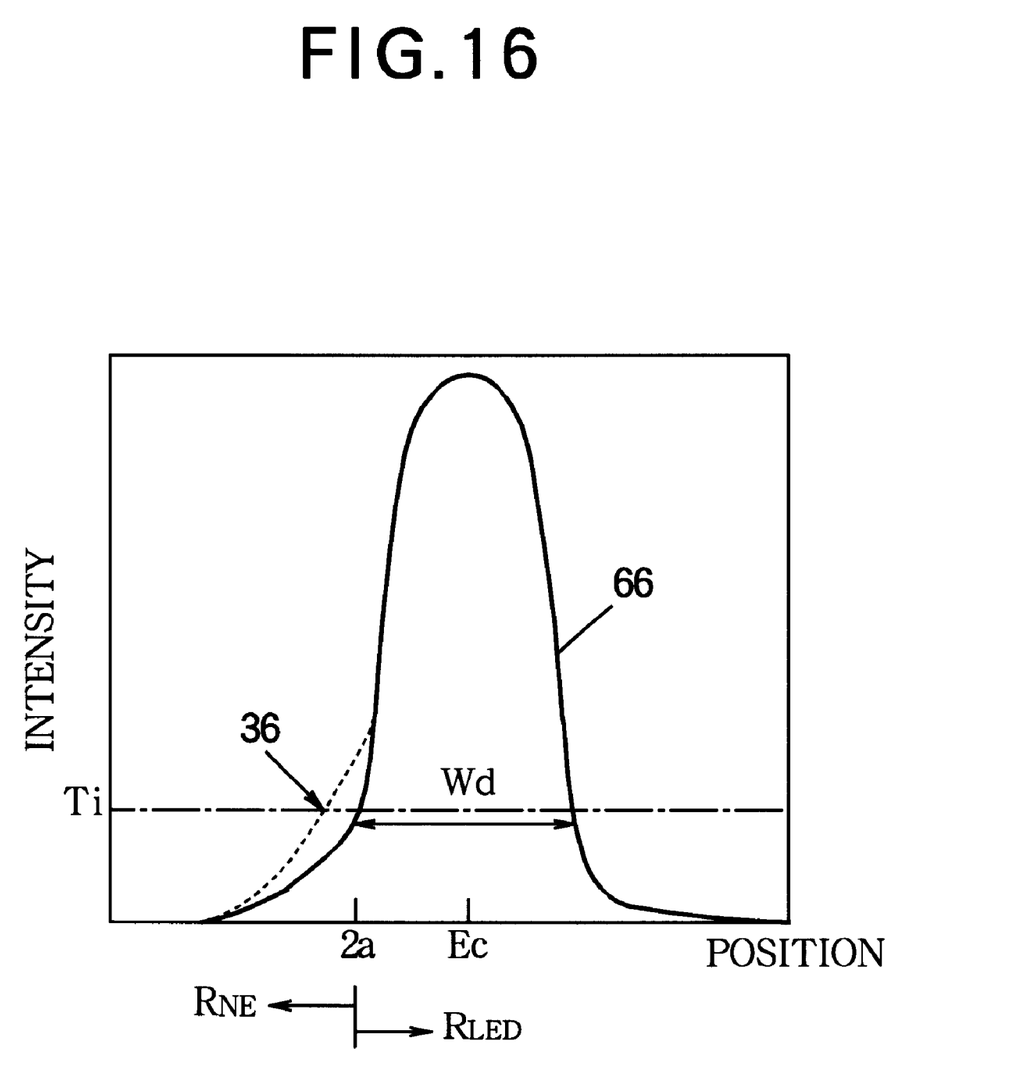
FIG. 16 is a graph comparing light intensity distributions in the third embodiment and the conventional LED print head.

FIG. 16 compares the light intensity profiles of the third embodiment and the conventional art. The vertical and horizontal axes have the same meaning as in FIG. 8. The intensity profile 66 of the third embodiment is wider than in the first embodiment, but is still more narrow than the conventional intensity profile 36. Furthermore, most of the widening of the intensity profile 66 in the third embodiment occurs below the threshold intensity Ti of the photosensitive drum. At the threshold intensity level Ti, the width Wd of intensity profile 66 is nearly the same as in the first embodiment. Accordingly, although the conductive paste 65 in the third embodiment does not completely eliminate reflection, the reflection is too weak to cause significant printing problems.

Figure 17:
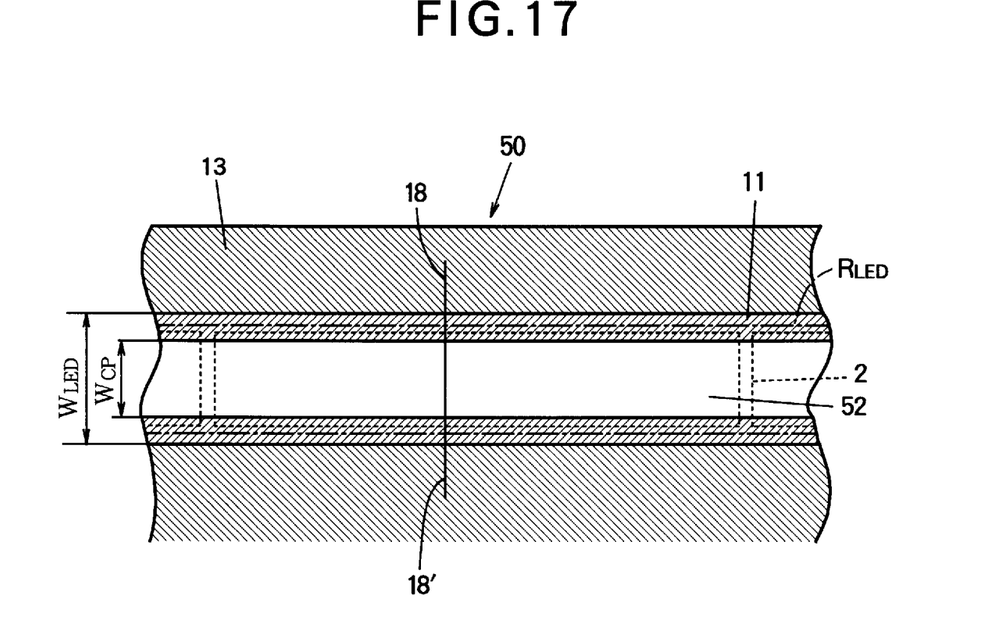
FIG. 17 is a plan view of part of the LED unit in a fourth embodiment the invention.

A fourth embodiment of the invention is an LED print head with an LED unit combining the LED array chips 2, driver ICs 3, and bonding wires 4, 6, of the conventional art with the printed circuit board 50 shown in FIG. 17. The conductive ground pattern 52 of this printed circuit board 50 is confined to the region $R_{LED}$ below the LED array chips 2. The conductive paste 5 is substantially confined to this region $R_{LED}$.

Figure 18:
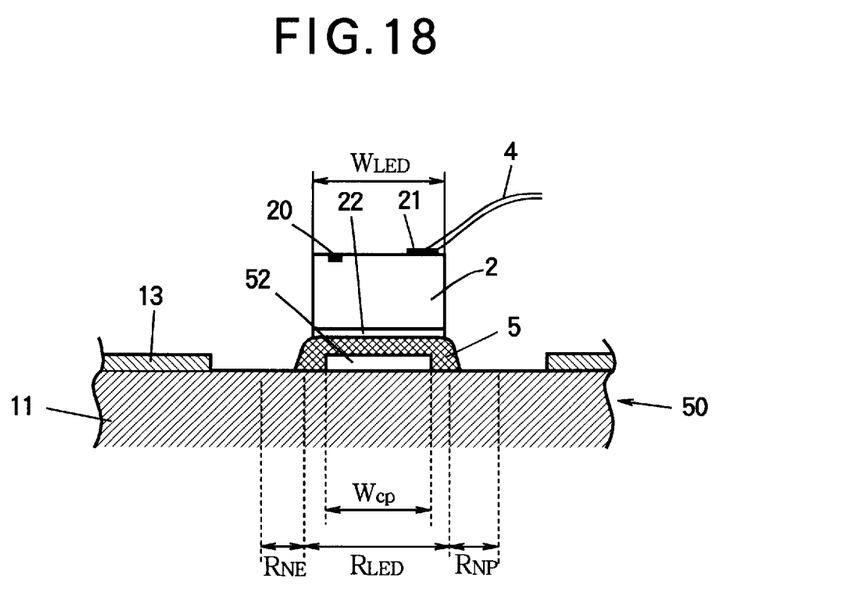
FIG. 18 is a sectional view through line 18—18' in FIG. 17.

Referring to FIG. 18, the width $W_{cp}$ of the conductive ground pattern 52 is slightly less than the width $W_{LED}$ of the LED array chips 2, to ensure that the ground pattern 52 does not extend into the region $R_{NE}$ adjacent the edges of the LED array chips 2 near the LEDs 20. If the width of the LED array chips 2 is five hundred micrometers ($W_{LED}$=500 μm) and the mounting alignment accuracy of the LED array chips 2 is ±10 μm, for example, then the width of the conductive ground pattern 52 should be at most four hundred ninety micrometers ($W_{cp} \leq 490$ μm). If alignment error causes the conductive ground pattern 52 to extend slightly into the adjacent region $R_{NP}$ on the other side of the LED array chips 2, no harm occurs.

The conductive ground pattern 52 comprises gold-plated copper foil, as in the previous embodiments. Since the conductive ground pattern 52 is narrower than in the previous embodiments but must still carry return current from all of the LED array chips 2 with negligible voltage drop, the conductive ground pattern 52 is preferably connected by through holes (not visible) to a conductive ground plane (not visible) disposed on the underside of the dielectric substrate 11, or to a conductive ground pattern disposed in an intermediate layer of the printed circuit board 50.

The dielectric substrate 11 comprises a glass-epoxy material. The dielectric substrate 11 is left exposed in the regions $R_{NE}$ and $R_{NP}$ adjacent to the region $R_{LED}$ under the LED array chips 2. The dielectric coating 13 may extend closer to the conductive ground pattern 52 than shown in FIG. 18, if necessary by reducing the width of the adjacent regions $R_{NE}$, $R_{NP}$, provided at least some space is left between the dielectric coating 13 and the LED array chips 2. If the dielectric coating 13 extends close enough to the conductive ground pattern 52 to affect the seating of the LED array chips 2, the thickness of the dielectric coating 13 should be equal to or less than the thickness of the conductive ground pattern 52, so that even if one edge of an LED array chip 2 partly overlaps the dielectric coating 13, this will not lead to tilting of the LED array chip.

When the LED array chips 2 are mounted, first the conductive paste 5 is applied in the region $R_{LED}$, entirely covering the conductive ground pattern 52. The LED array chips 2 are placed on the conductive paste 5, pressed down, and aligned; then the conductive paste 5 is cured, e.g., by heating.

During operation, light leaking through the edges of the LED array chips 2 may reach the dielectric substrate 11, but the glass epoxy material constituting the dielectric substrate 11 is even less reflective than the conductive silver paste of the third embodiment. Most of the incident light is absorbed by the dielectric substrate 11; very little light is reflected into the lens array.

Figure 19:
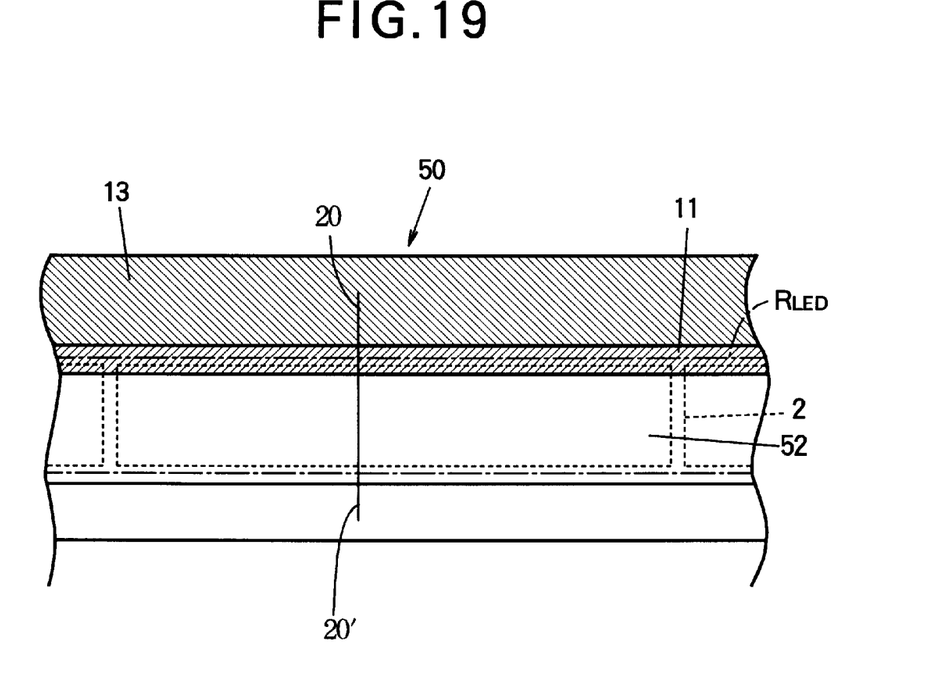
FIG. 19 is a plan view of part of the LED unit in a variation of the fourth embodiment.
Figure 20:
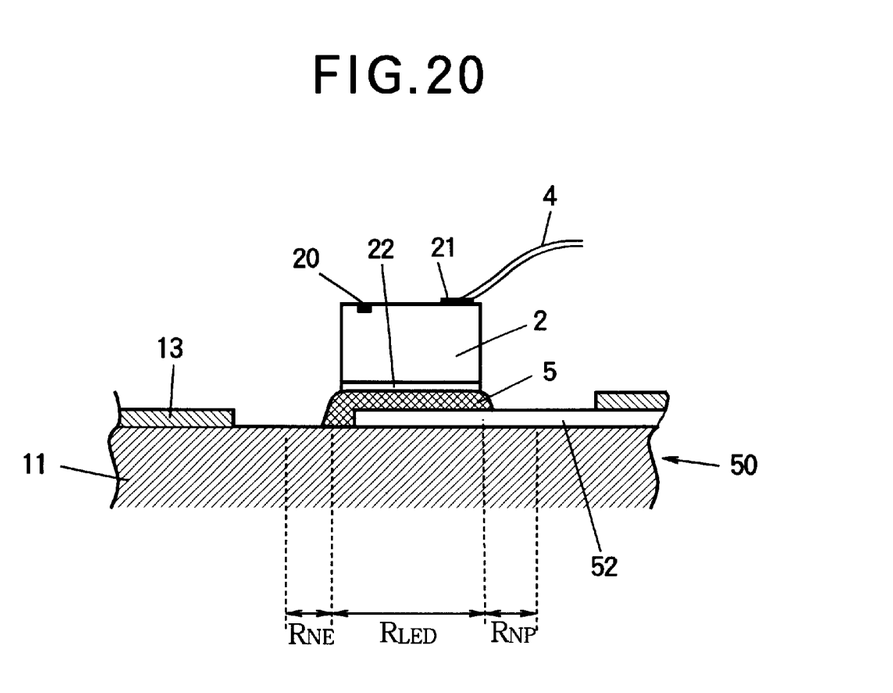
FIG. 20 is a sectional view through line 20—20' in FIG. 19.

Referring to FIG. 19, in a variation of the fourth embodiment, the conductive ground pattern 52 is not confined to the region $R_{LED}$ in which the LED array chips 2 are mounted. Referring to FIG. 20, the conductive ground pattern extends through the adjacent region $R_{NP}$, and for some distance beyond. Although the conductive ground pattern 52 is exposed in region $R_{NP}$, this does not lead to reflection problems, because region $R_{NP}$ is on the opposite side from the LEDs 20. The conductive ground pattern 52 does not extend into the adjacent region $R_{NE}$ on the LED side, where only the dielectric substrate 11 and a small amount of conductive paste 5 are exposed.

The third and fourth embodiments should be compared with the conventional art shown in FIG. 5. In both these embodiments and the conventional art, light leaking through the edge of the LED array chips 2 cannot reach the conductive ground pattern 12, so the problem of reflection does not occur. In the third and fourth embodiments, however, the problem of tilting is also avoided.

The third and fourth embodiments may also be compared with the conventional art shown in FIG. 4. The same protection from tilting is provided by both these embodiments and the conventional art, but the embodiments also solve the problem of light reflection, which is not solved in the conventional art.

By reducing reflection to a substantially negligible level without incurring the risk of tilting of the LED array chips, the third and fourth embodiments enhance printing quality without detriment to manufacturing yields.

Several variations of the preceding embodiments have been shown or described, but those skilled in the art will recognize that further variations are possible within the scope claimed below.

What is claimed is:

1. A light emitting diode (LED) print head having at least one LED array chip and a printed circuit board on which the LED array chip is mounted, the LED array chip having a first surface, a second surface opposite the first surface, a first edge, a second edge opposite the first edge, and an array of light-emitting diodes emitting light through the first surface, some of the light also leaking through the first edge, wherein the printed circuit board comprises:

a component surface with a first region and a second region, the LED array chip being mounted in the first region, the first region extending from the first edge of the LED array chip to the second edge of the LED array chip, the second region being adjacent to the first region and adjacent to all parts of the first edge of the LED array chip;

a conductive pattern to which the second surface of the LED array chip is electrically coupled and mechanically bonded in the first region, the conductive pattern being wholly disposed in a part of the printed circuit board outside the second region of the component surface.

2. The LED print head of claim 1, wherein the component surface of the printed circuit board is partly covered by a dielectric coating.

3. The LED print head of claim 2, wherein the conductive pattern is at least as thick as the dielectric coating.

4. A light emitting diode (LED) print head having at least one LED array chip and a printed circuit board on which the LED array chip is mounted, the LED array chip having a first surface, a second surface opposite the first surface, a first edge, a second edge opposite the first edge, and an array of light-emitting diodes emitting light through the first surface, some of the light also leaking through the first edge, wherein the printed circuit board comprises:

a component surface with a first region and a second region, the LED array chip being mounted in the first region, the first region extending from the first edge of the LED array chip to the second edge of the LED array chip, the second region being adjacent to the first region and adjacent to all parts of the first edge of the LED array chip;

a conductive pattern to which the second surface of the LED array chip is electrically coupled and mechanically bonded in the first region; and a dielectric coating protecting the component surface of the printed circuit board, partly disposed in the first region, horizontally supporting the second surface of the LED array chip at both the first edge and the second edge of the LED array chip, and covering the conductive pattern in the second region, said dielectric coating being less optically reflective than the conductive pattern, said dielectric coating absorbing at least some of the light that leaks through the first edge of the LED array chip.

5. The LED print head of claim 4, wherein said dielectric coating supports the second surface of the LED array chip all along said first edge.

6. The LED print head of claim 4, wherein said dielectric coating supports the second surface of the LED array chip all along said second edge.

7. The LED print head of claim 4, wherein said dielectric coating includes islands supporting the second surface of the LED array chip at a plurality of points along said second edge.

8. The LED print head of claim 4, wherein said dielectric coating includes bridges extending across said first region, supporting the second surface of the LED array chip at a plurality of points along said second edge.

9. A light emitting diode (LED) print head having at least one LED array chip and a printed circuit board on which the LED array chip is mounted, the LED array chip having a first surface, a second surface opposite the first surface, a first edge, a second edge opposite the first edge, and an array of light-emitting diodes emitting light through the first surface, some of the light also leaking through the first edge, wherein the printed circuit board comprises:

a component surface with a first region and a second region, the LED array chip being mounted in the first region, the first region extending from the first edge of the LED array chip to the second edge of the LED array chip, the second region being adjacent to the first region and adjacent to all parts of the first edge of the LED array chip;

a conductive pattern to which the second surface of the LED array chip is electrically coupled and mechanically bonded in the first region; and a conductive paste that electrically couples and mechanically bonds the second surface of the LED array chip to the conductive pattern in the first region, and covers the conductive pattern in the second region, said conductive paste being less optically reflective than the conductive pattern, said conductive paste absorbing at least some of the light that leaks through the first edge of the LED array chip.

10. The LED print head of claim 9, wherein said conductive paste comprises silver particles and a resin.

11. The LED print head of claim 10, wherein said conductive paste also comprises carbon black.

* * * * *